United States Patent
Tomita

(10) Patent No.: US 9,810,989 B2
(45) Date of Patent: Nov. 7, 2017

(54) EDGE EXPOSURE APPARATUS, EDGE EXPOSURE METHOD AND NON-TRANSITORY COMPUTER STORAGE MEDIUM

(71) Applicant: Tokyo Electron Limited, Tokyo (JP)

(72) Inventor: Hiroshi Tomita, Koshi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 15/015,254

(22) Filed: Feb. 4, 2016

(65) Prior Publication Data

US 2016/0246187 A1    Aug. 25, 2016

(30) Foreign Application Priority Data

Feb. 25, 2015  (JP) ................................. 2015-035309

(51) Int. Cl.
    *G03B 27/32*    (2006.01)
    *G03B 27/52*    (2006.01)
    *G03F 7/20*     (2006.01)

(52) U.S. Cl.
    CPC .......... *G03F 7/2028* (2013.01); *G03F 7/2022* (2013.01)

(58) Field of Classification Search
    CPC ............................. G03F 7/2022; G03F 7/2028
    USPC ........................................ 355/27, 30, 72, 77
    See application file for complete search history.

(56) References Cited

U.S. PATENT DOCUMENTS

| | | | | |
|---|---|---|---|---|
| 5,880,816 A | * | 3/1999 | Mimura | G03F 7/2028 355/53 |
| 5,929,976 A | * | 7/1999 | Shibuya | G03F 7/2028 355/53 |
| 6,052,173 A | * | 4/2000 | Miura | H01L 21/681 355/53 |

FOREIGN PATENT DOCUMENTS

JP    H10-256121 A    9/1998

* cited by examiner

*Primary Examiner* — Colin Kreutzer
(74) *Attorney, Agent, or Firm* — Posz Law Group, PLC

(57) ABSTRACT

An edge exposure apparatus includes: an imaging unit that images a front surface of a substrate; a substrate holding unit; an exposure unit that exposes an edge portion of the substrate held on the substrate holding unit; a first moving mechanism that moves and rotates the substrate holding unit; a second moving mechanism that moves the exposure unit; and a control unit that controls the first moving mechanism and the second moving mechanism, wherein the first moving mechanism and the second moving mechanism are controlled so as to acquire array information of shots of a pattern on the substrate from a substrate image of a substrate, which has already been subjected to pattern exposure, imaged by the imaging unit, and expose the edge portion of the substrate, based on the acquired array information.

13 Claims, 10 Drawing Sheets

| STEP | EXPOSURE START POSITION (X, Y) | EXPOSURE END POSITION (X, Y) |
|---|---|---|
| 1 | (75, 150) | (-75, 150) |
| 2 | (-45, 135) | (-105, 135) |
| 3 | (-75, 120) | (-120, 120) |
| 4 | (-90, 105) | (-135, 105) |
| 5 | (-105, 120) | (-105, 90) |
| 6 | (-120, 105) | (-120, 45) |
| 7 | (-135, 75) | (-135, -75) |
| . | (..., ...) | (..., ...) |
| . | (..., ...) | (..., ...) |
| . | (..., ...) | (..., ...) |

FIG.14

$$\begin{pmatrix} X_\theta \\ Y_\theta \\ 1 \end{pmatrix} = \begin{pmatrix} \cos\theta & -\sin\theta & \Delta X \\ \sin\theta & \cos\theta & \Delta Y \\ 0 & 0 & 1 \end{pmatrix} \cdot \begin{pmatrix} X \\ Y \\ 1 \end{pmatrix}$$

EDGE EXPOSURE APPARATUS, EDGE EXPOSURE METHOD AND NON-TRANSITORY COMPUTER STORAGE MEDIUM

CROSS REFERENCE TO RELATED APPLICATIONS

This application is based upon and claims the benefit of priority of the prior Japanese Patent Application No. 2015-035309, filed in Japan on Feb. 25, 2015, the entire contents of which are incorporated herein by reference.

BACKGROUND OF THE INVENTION

1. Field of the Invention

The present invention relates to an edge exposure apparatus, an edge exposure method, and a non-transitory computer storage medium.

2. Description of the Related Art

In photolithography processing in manufacture of a semiconductor device, for example, resist coating treatment of applying a resist solution onto a semiconductor wafer (hereinafter, referred to as a "wafer") as a substrate to form a resist film, edge exposure processing of selectively exposing an edge portion of the resist film, exposure processing of exposing the resist film, whose edge portion has been exposed, to a predetermined pattern, developing treatment of developing the exposed resist film and so on are performed in sequence to form a predetermined resist pattern on the wafer. A series of treatment and processing is performed by a substrate treatment system equipped with a plurality of various treatment and processing apparatuses that perform treatments and processing on the wafer and transfer mechanisms that transfer the wafer, and an exposure apparatus.

In the edge exposure, by applying light to the edge portion of the resist film with the wafer held on a spin chuck and rotating the spin chuck around a vertical axis, the wafer edge portion is exposed in a ring shape with a predetermined width. However, exposure of a rectangular pattern is performed in the exposure apparatus, so that a region where neither of the edge exposure nor the pattern exposure is performed exists at the edge portion of the wafer. For this reason, in the exposure apparatus, exposure processing so-called dummy shot is performed on the region where exposure is not performed.

However, performing the dummy shot not in use for actual products in the exposure apparatus means a reduction in throughput of the exposure apparatus. Therefore, Japanese Patent Application Laid-open No. H10-256121 suggests that the dummy shot is performed in an edge exposure apparatus. Specifically, in the edge exposure apparatus, an orientation flat or a notch of the wafer is detected and the position of the wafer is recognized and the position adjustment of the wafer is performed. Then, a light source is scanned in an X-direction and a Y-direction to thereby perform a rectangular dummy shot on the edge portion of the wafer W.

SUMMARY OF THE INVENTION

Incidentally, an array direction of shots of a pattern and a line linking the notch and the center of the wafer or the orientation flat are generally in a perpendicular or parallel relationship. Therefore, in aforementioned Japanese Patent Application Laid-open No. H10-256121, the edge exposure processing is performed along a direction parallel or perpendicular to the orientation flat.

However, the shots of the pattern to be exposed in the exposure apparatus are not always arrayed in a state of being parallel or perpendicular to the line linking the orientation flat or the notch and the center of the wafer. In this case, as information for scanning the light source for the dummy shot, only the position of the orientation flat or the notch detected in the edge exposure apparatus is insufficient.

The present invention has been made in consideration of the above points, and its object is to appropriately perform a dummy shot by an edge exposure apparatus.

An aspect of the present invention is an edge exposure apparatus for exposing an edge portion of a substrate coated with a resist film, the edge exposure apparatus including: an imaging unit that images a front surface of the substrate; a substrate holding unit that holds the substrate; an exposure unit that exposes the edge portion of the substrate held on the substrate holding unit; a first moving mechanism that moves and rotates the substrate holding unit; a second moving mechanism that moves the exposure unit; and a control unit that controls the first moving mechanism and the second moving mechanism. The control unit is configured to control the first moving mechanism and the second moving mechanism so as to acquire array information of shots of a pattern on the substrate from a substrate image of a substrate, which has already been subjected to pattern exposure, imaged by the imaging unit, and expose the edge portion of the substrate, based on the acquired array information.

According to the one aspect of the present invention, even if the array of the shots of the pattern exposed in the exposure apparatus is not in a state of being parallel or perpendicular to the line linking an orientation flat or a notch and the center the wafer, the dummy shot can be appropriately performed on the edge portion, based on the acquired array information.

An aspect of the present invention in another viewpoint is an edge exposure method using an edge exposure apparatus, the edge exposure apparatus including: an imaging unit that images a front surface of a substrate; a substrate holding unit that holds the substrate; an exposure unit that exposes an edge portion of the substrate held on the substrate holding unit; a first moving mechanism that moves and rotates the substrate holding unit; and a second moving mechanism that moves the exposure unit. The edge exposure method includes: moving the substrate holding unit and the exposure unit so as to acquire array information of shots of a pattern on the substrate from a substrate image of a substrate, which has already been subjected to pattern exposure, imaged by the imaging unit, and expose the edge portion of the substrate, based on the acquired array information.

An aspect of the present invention in still another viewpoint is a non-transitory computer-readable storage medium storing a program running on a computer of a control unit configured to control the edge exposure apparatus to cause the edge exposure apparatus to perform the edge exposure method.

BRIEF DESCRIPTION OF THE DRAWINGS

FIG. 14 is a determinant for performing affine transformation.

DETAILED DESCRIPTION OF THE INVENTION

Figure 1:
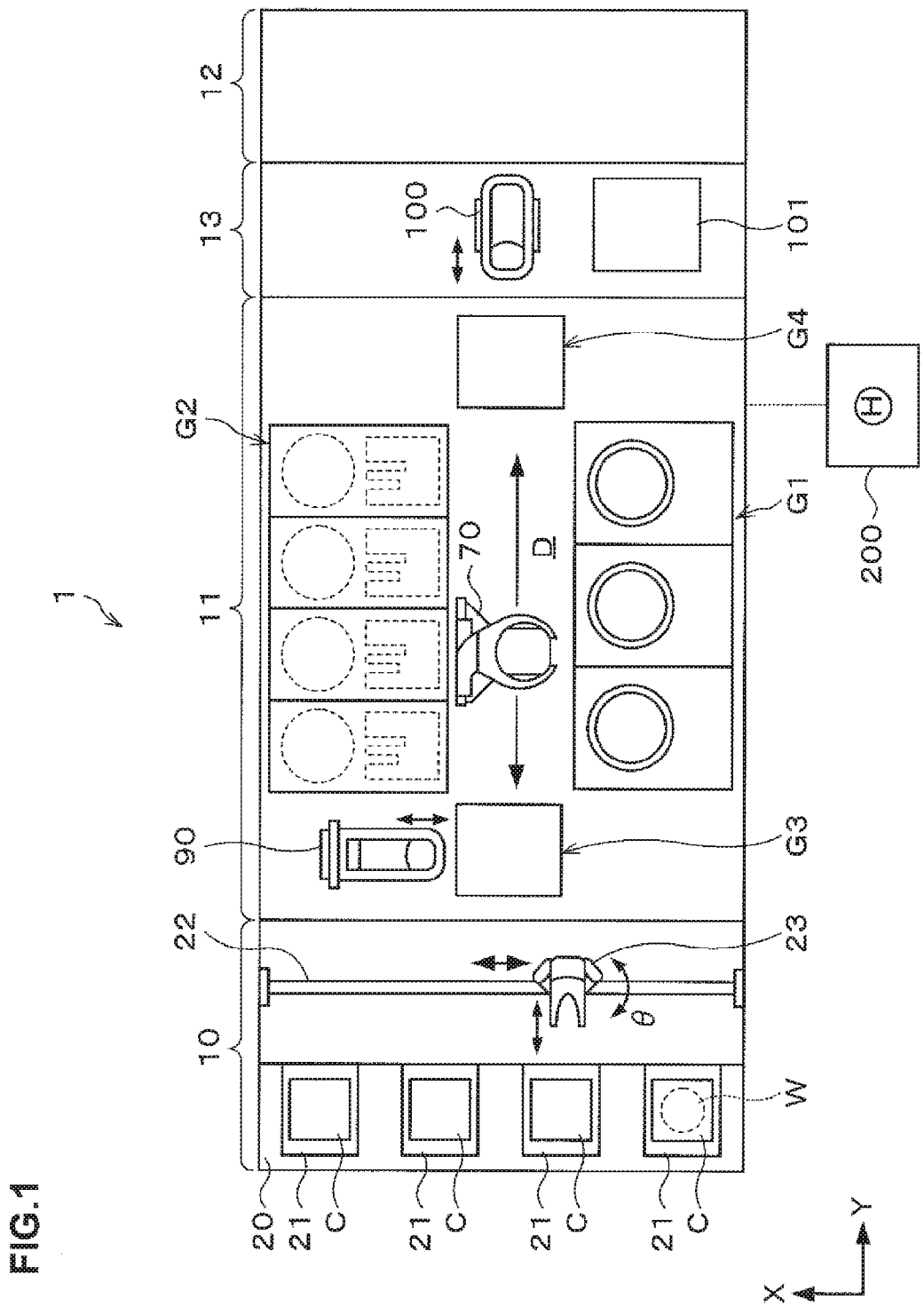
FIG. 1 is a plan view illustrating the outline of a configuration of a substrate treatment system according to an embodiment.
Figure 2:
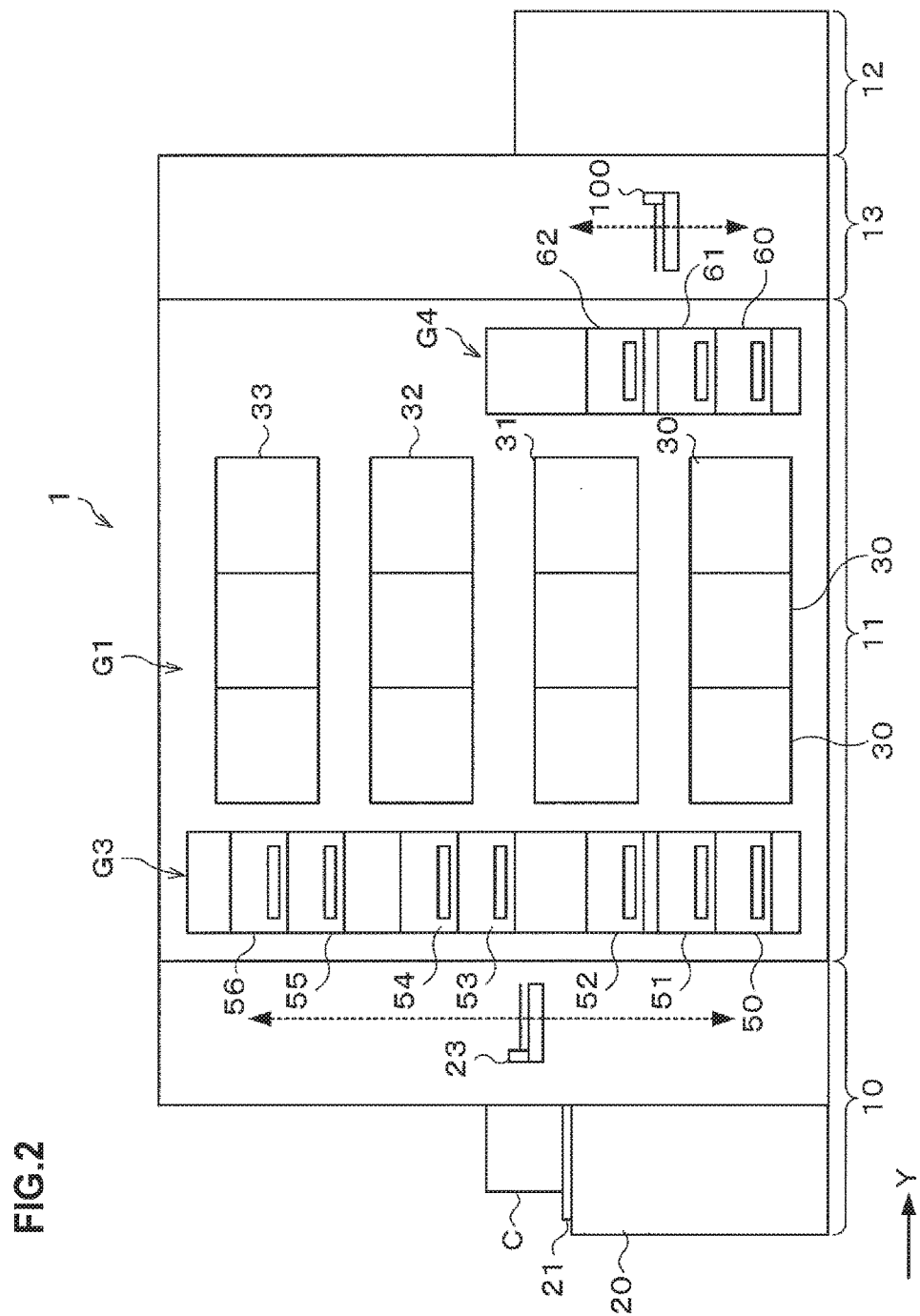
FIG. 2 is a front view illustrating the outline of the configuration of the substrate treatment system according to this embodiment.
Figure 3:
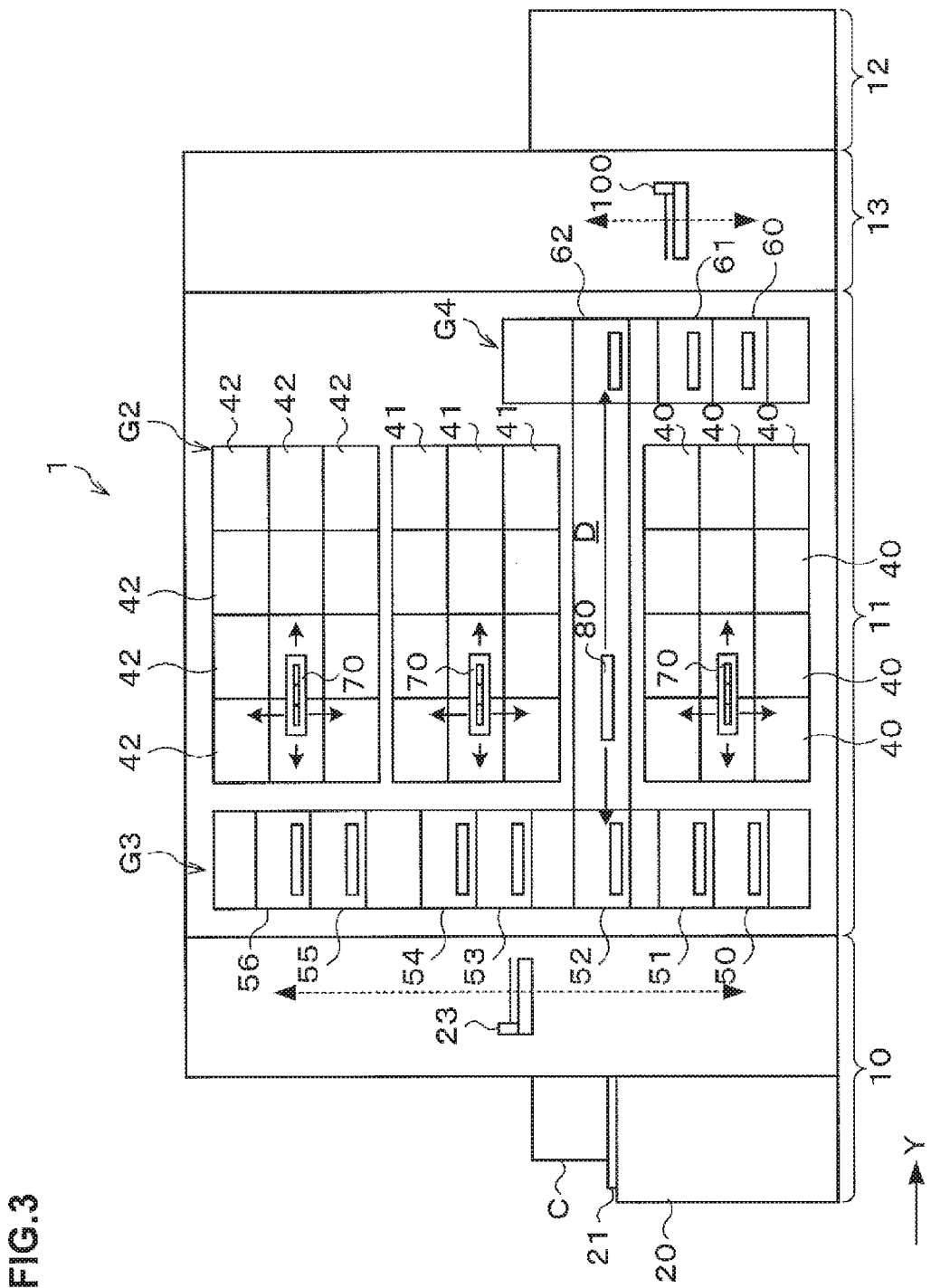
FIG. 3 is a rear view illustrating the outline of the configuration of the substrate treatment system according to this embodiment.

Hereinafter, an embodiment of the present invention will be described. FIG. 1 is an explanatory view illustrating the outline of a configuration of a substrate treatment system 1 including an edge exposure apparatus according to this embodiment. FIG. 2 and FIG. 3 are a front view and a rear view illustrating the outline of an internal configuration of the substrate treatment system 1 respectively. Note that the substrate treatment system 1 in this embodiment is a coating and developing treatment system that performs coating and developing treatments on a wafer W.

The substrate treatment system 1 has, as illustrated in FIG. 1, a configuration in which a cassette station 10 into/out of which a cassette C housing a plurality of wafers W is transferred, a treatment station 11 equipped with a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (an X-direction negative direction side in FIG. 1) in the treatment station 11, and the second block G2 is provided on the rear side (an X-direction positive direction side in FIG. 1) in the treatment station 11. Further, the third block G3 is provided on the cassette station 10 side (a Y-direction negative direction side in FIG. 1) in the treatment station 11, and the fourth block G4 is provided on the interface station 13 side (a Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution onto the wafer W to form a resist film, and upper anti-reflection film forming apparatuses 33 each of which forms an anti-reflection film (hereinafter, referred to as an "upper anti-reflection film") at an upper layer of the resist film of the wafer W, are stacked in order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the developing treatment apparatus 30, the lower anti-reflection film forming apparatus 31, the resist coating apparatus 32, and the upper anti-reflection film forming apparatus 33, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W.

For example, in the second block G2, as illustrated in FIG. 3, thermal treatment apparatuses 40 each of which performs a thermal treatment such as heating and cooling on the wafer W, adhesion apparatuses 41 each for enhancing fixation between the resist solution and the wafer W, and edge exposure apparatuses 42 each of which exposes the outer peripheral portion of the wafer W, are arranged side by side in the vertical direction and in the horizontal direction. Also the numbers and the arrangement of the thermal treatment apparatuses 40, the adhesion apparatuses 41, and the edge exposure apparatuses 42 can be arbitrarily selected. Note that the configuration of the edge exposure apparatus 42 will be described later.

For example, in the third block G3, an inspection apparatus 50, a plurality of delivery apparatuses 51, 52, 53, 54, 55, 56 are provided in order from the bottom. Further, in the fourth block G4, a plurality of delivery apparatuses 60, 61, 62 are provided in order from the bottom. The configurations of the inspection apparatus 50 will be described later.

In a region surrounded by the first block G1 to the fourth block G4, a wafer transfer region D is formed as illustrated in FIG. 1. In the wafer transfer region D, for example, a plurality of wafer transfer apparatuses 70 are arranged each of which has a transfer arm that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 or the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 90 is provided adjacent, on the X-direction positive direction side, to the third block G3. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to/from each of the delivery apparatuses in the fourth block G4, the delivery apparatus 101 and the exposure apparatus 12, for example, while supporting the wafer W by the transfer arm.

Figure 4:
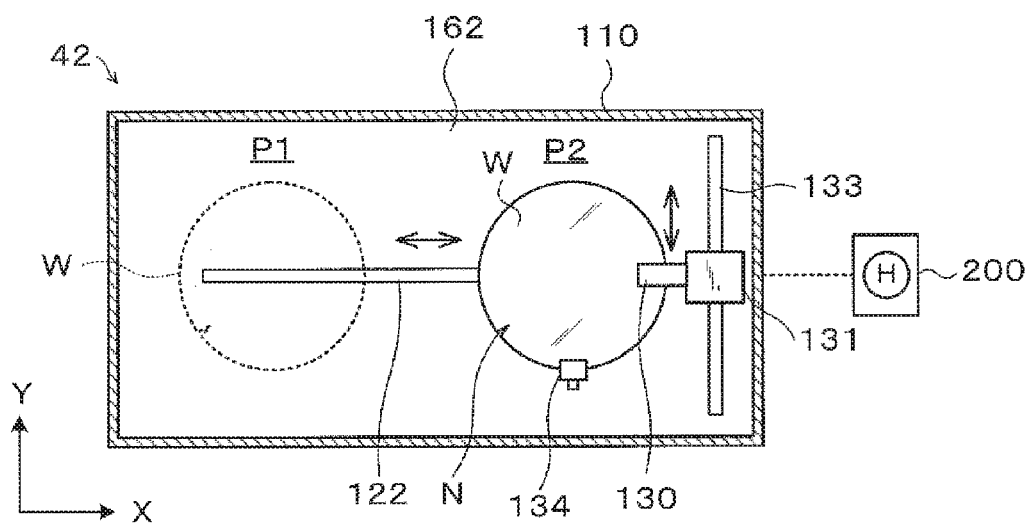
FIG. 4 is a transverse sectional view illustrating the outline of a configuration of an edge exposure apparatus.
Figure 5:
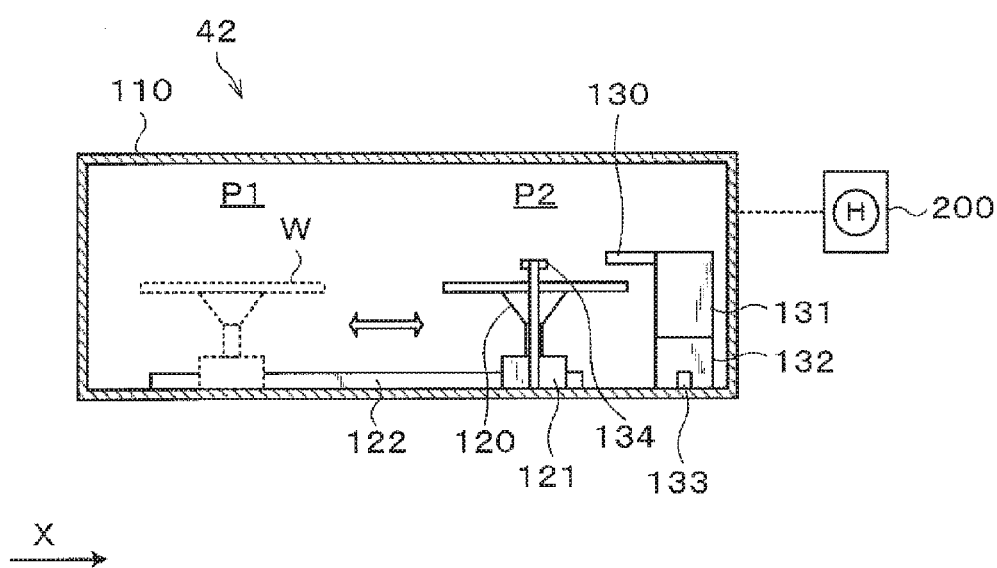
FIG. 5 is a longitudinal sectional view illustrating the outline of the configuration of the edge exposure apparatus.

Next, the configuration of the edge exposure apparatus 42 will be described. The edge exposure apparatus 42 has a housing 110 as illustrated in FIG. 4 and FIG. 5. In a side surface of the housing 110, a not-illustrated transfer-in/out port for transferring in/out the wafer W is formed. Inside the housing 110, a wafer chuck 120 is provided as a substrate holding unit that suction-holds the wafer W thereon. The wafer chuck 120 has a horizontal upper surface, and the upper surface is provided with, for example, a suction port (not illustrated) for sucking the wafer W. By suction from the suction port, the wafer W can be suction-held on the wafer chuck 120.

To the wafer chuck 120, a chuck drive unit 121 as a first moving mechanism is attached as illustrated in FIG. 5. At a bottom surface of the housing 110, a guide rail 122 is provided which extends from one end side (an X-direction negative direction side in FIG. 5) to the other end side (an X-direction positive direction side in FIG. 5) in the housing 110. The chuck drive unit 121 is provided on the guide rail 122.

The chuck drive unit 121 has, for example, a motor (not illustrated) built therein and is configured to rotate the wafer chuck 120 and be movable along the guide rail 122 between a delivery position P1 where the wafer W is delivered from/to the outside of the wafer processing apparatus 42 and an edge exposure position P2 where edge exposure processing is performed on the edge portion of the wafer W.

Inside the housing 110, an exposure unit 130 is provided which applies light to the edge portion of the resist film on the wafer W held on the wafer chuck 120 to thereby expose the edge portion. In the exposure unit 130, a lamphouse 131 is provided as a light source supplying light to the exposure unit 130. Inside the lamphouse 131, an ultra-high pressure mercury lamp (not illustrated) and a collection mirror (not illustrated) collecting the light from the ultra-high pressure mercury lamp are provided. The exposure unit 130 is further provided with a not-illustrated rectangular slit and is configured such that rectangular light passed through the slit is applied from the exposure unit 130. Note that an opening of the slit producing the rectangular light is set to be the same or smaller than the dimension of a later-described shot SH of a pattern. The exposure unit 130 and the lamphouse 131 are arranged on the X-direction positive direction side of the edge exposure position P2, namely, at an X-direction positive direction side end portion of the housing 110.

The lamphouse 131 is supported, for example, at its lower surface, by an exposure drive unit 132 as a second moving mechanism. Further, on a lower surface of the exposure drive unit 132, a guide rail 133 is provided which extends along a direction (a Y-direction in FIG. 4) perpendicular to the guide rail 122. The exposure drive unit 132 has, for example, a motor (not illustrated) built therein and is configured to be movable along the guide rail 133. Thus, the exposure unit 130 is movable along the Y-direction from above one end portion of the wafer W to above the other end portion.

Inside the housing 110 and at the edge exposure position P2, a position detection sensor 134 is provided which detects the position of the edge portion of the wafer W held on the wafer chuck 120. The position detection sensor 134 has, for example, a CCD camera (not illustrated) to detect an eccentricity amount from the center of the wafer W held on the wafer chuck 120 and the position of a notch portion N of the wafer W. Further, it is possible to rotate the wafer chuck 120 by the chuck drive unit 121 to adjust the position of the notch portion N of the wafer W while detecting the position of the notch portion N by the position detection sensor 134.

The devices in the edge exposure apparatus 42 such as the chuck drive unit 121, the exposure drive unit 132, the exposure unit 130, and the position detection sensor 134 are connected to a later-described control unit 200 so that their operations are controlled by the control unit 200.

Next, a configuration of the inspection apparatus 50 will be described.

Figure 6:
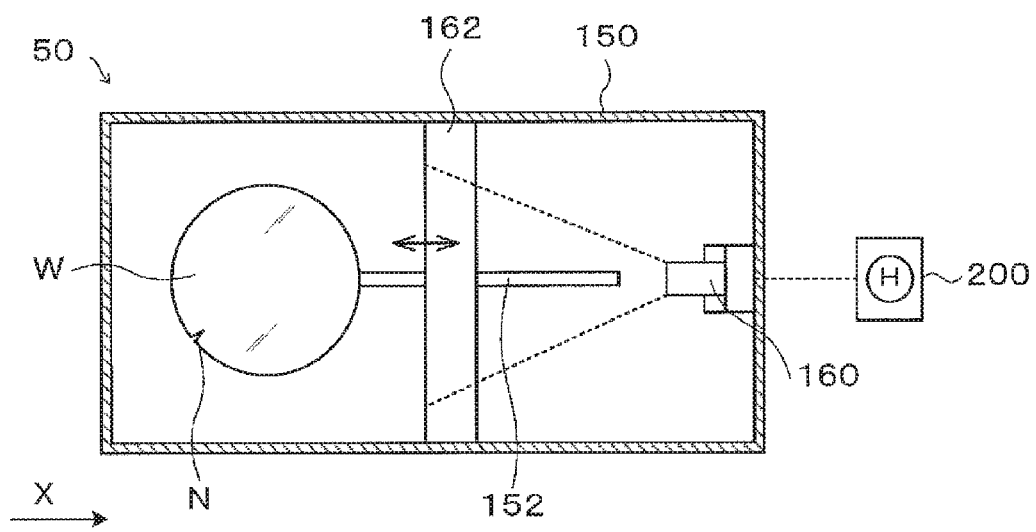
FIG. 6 is a transverse sectional view illustrating the outline of a configuration of an inspection apparatus.
Figure 7:
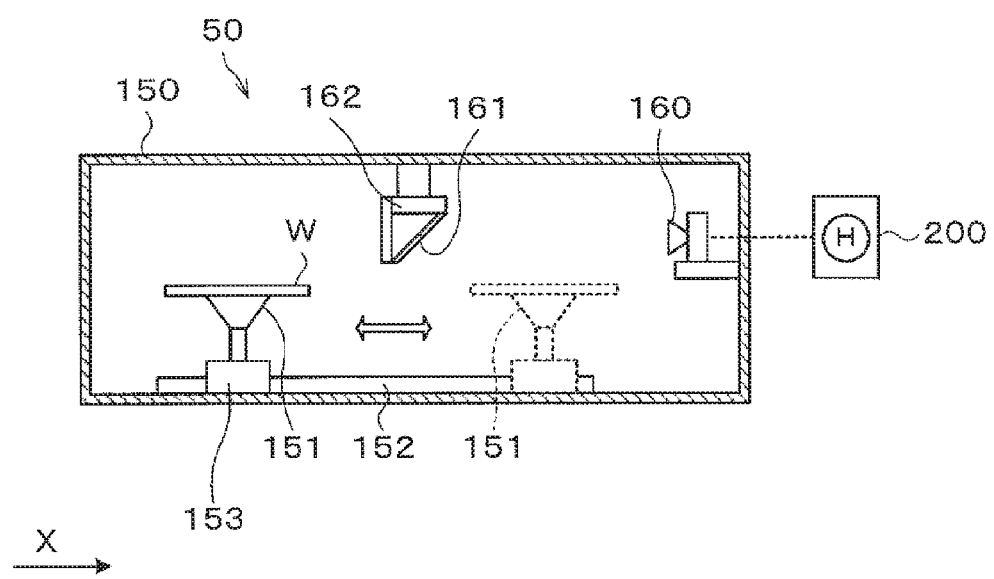
FIG. 7 is a longitudinal sectional view illustrating the outline of the configuration of the inspection apparatus.

The inspection apparatus 50 has a casing 150 as illustrated in FIG. 6. Inside the casing 150, a wafer chuck 151 that holds the wafer W is provided as illustrated in FIG. 7. At the bottom surface of the casing 150, a guide rail 152 is provided which extends from one end side (an X-direction negative direction side in FIG. 7) to the other end side (an X-direction positive direction side in FIG. 7) in the casing 150. On the guide rail 152, a drive unit 153 is provided which rotates the wafer chuck 151 and is movable along the guide rail 152.

On a side surface on the other end side (the X-direction positive direction side in FIG. 7) inside the casing 150, an imaging unit 160 is provided. As the imaging unit 160, for example, a wide-angle CCD camera is used. Near the upper middle of the casing 150, a half mirror 161 is provided. The half mirror 161 is provided at a position facing the imaging unit 160 and in a state that its mirror surface is inclined upward at 45 degrees toward the imaging unit 160 from a state of being directed vertically downward. Above the half mirror 161, an illumination device 162 is provided. The half mirror 161 and the illumination device 162 are fixed to the upper surface of the inside of the casing 150. The illumination from the illumination device 162 passes through the half mirror 161 and is applied downward. Accordingly, light reflected off an object existing below the illumination device 162 is further reflected off the half mirror 161 and captured into the imaging unit 160. In other words, the imaging unit 160 can image the object existing within an irradiation region by the illumination device 162. Then, the imaged image of the wafer W (substrate image) is inputted into the later-described control unit 200.

Note that in this embodiment, the imaging unit 160 disposed in the inspection apparatus 50 functions as an imaging unit of the edge exposure apparatus 42 of the present invention, and the imaging unit 160 may be disposed outside the edge exposure apparatus 42 as in this embodiment.

In the above substrate treatment system 1, the control unit 200 is provided as illustrated in FIG. 1. The control unit 200 is, for example, a computer and has a program storage unit (not illustrated). In the program storage unit, a program for executing the treatment and transfer of the wafer W in the substrate treatment system 1 and executing the edge exposure of the wafer W is stored in the program storage unit. Note that the program may be the one that is recorded, for example, in a non-transitory or a transitory computer-readable storage medium H such as a computer-readable hard disk (HD), flexible disk (FD), compact disk (CD), magneto-optical disk (MO), or memory card, and installed from the storage medium H into the control unit 200.

Next, the treatment method of the wafer W performed using the substrate treatment 1 configured as described above will be described.

First, a cassette C housing a plurality of wafers W is transferred into the cassette station 10 of the substrate treatment system 1. Each of the wafers W in the cassette C has already been subjected to pattern exposure and is thus formed with a predetermined pattern, for example, by various treatment apparatuses outside the substrate treatment system 1. The wafers W in the cassette C are first transferred by the wafer transfer apparatus 23 to the inspection apparatus 50 in the treatment station 11.

In the inspection apparatus 50, front surfaces of the wafers W are sequentially imaged by the imaging unit 160, and images (substrate images) of the front surfaces of the wafers W are acquired. The substrate images imaged by the imaging unit 160 are inputted into the control unit 200.

Figure 8:
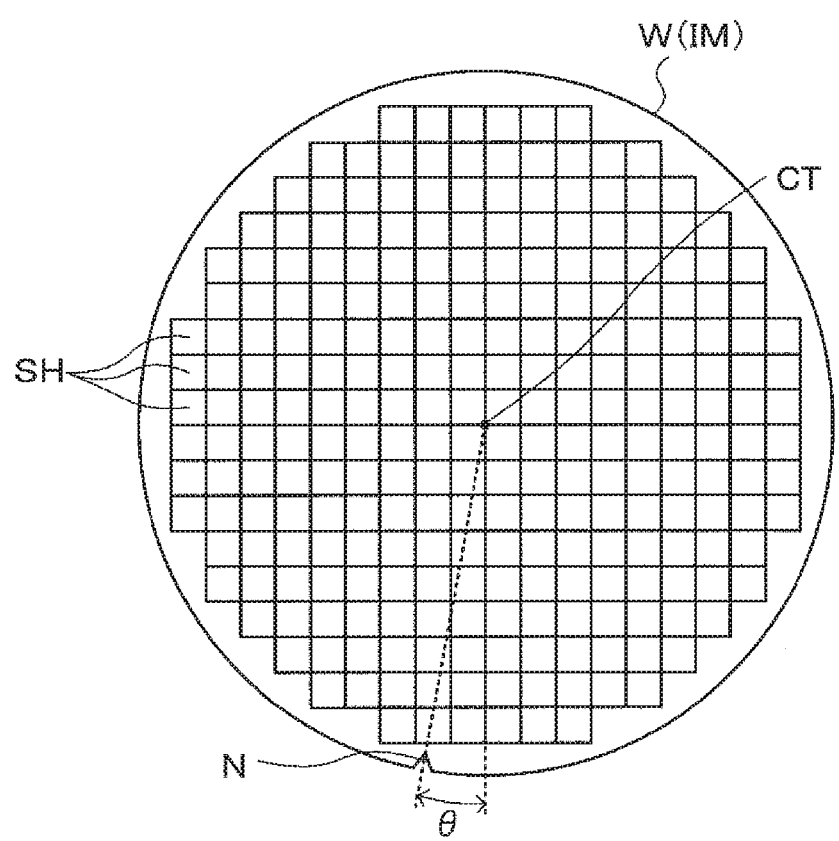
FIG. 8 is an explanatory view of a plane illustrating an array of shots of a pattern on the wafer.

The control unit 200 acquires information on the pattern formed on the wafer W on the basis of the substrate image. Specifically, in the case where shots SH of the pattern are arrayed on the wafer W as illustrated in FIG. 8, the control unit 200 acquires a center position CT of the wafer W, the dimension of one shot SH, the position of the notch portion N, and an array direction of the shots SH from a substrate image IM of the wafer W. Here, the array direction of the shots SH is obtained by calculating an angle θ formed between a straight line linking the center position CT of the wafer W and the position of the notch portion N and the array direction of the shots SH. Note that in FIG. 8, an example in the case where the shots SH each formed in a square with a side of 15 mm are formed, for example, in a wafer W having a diameter of 300 mm is drawn.

Then, the wafer W is transferred to the thermal treatment apparatus 40 in the second block G2 and temperature-regulated. Thereafter, the wafer W is transferred to the lower anti-reflection film forming apparatus 31 in the first block G1, in which a lower anti-reflection film is formed on the wafer W. The wafer W is then transferred to the thermal treatment apparatus 40 in the second block G2 and subjected to a heat treatment to be temperature-regulated.

Then, the wafer W is transferred to the adhesion apparatus 41 and subjected to an adhesion treatment. The wafer W is then transferred to the resist coating apparatus 32 in the first block G1, in which a resist film is formed on the wafer W.

After the resist film is formed on the wafer W, the wafer W is then transferred to the upper anti-reflection film forming apparatus 33 in the first block G1, in which an upper anti-reflection film is formed on the wafer W. Thereafter, the wafer W is transferred to the thermal treatment apparatus 40 in the second block G2 and subjected to a heat treatment. Thereafter, the wafer W is transferred by the wafer transfer apparatus 70 to the edge exposure apparatus 42 and subjected to edge exposure processing.

The edge exposure processing in the edge exposure apparatus 42 will be described in detail. The wafer W transferred to the edge exposure apparatus 42 is first delivered to the wafer chuck 120 at the delivery position P1. In this event, the wafer W is delivered by the wafer transfer apparatus 70 so that the center position CT of the wafer W acquired from the substrate image IM by the control unit 200 coincides with the rotation center of the wafer chuck 120. Thereafter, the wafer chuck 120 is moved by the chuck drive unit 121 from the delivery position P1 toward the edge exposure position P2.

Figure 9:
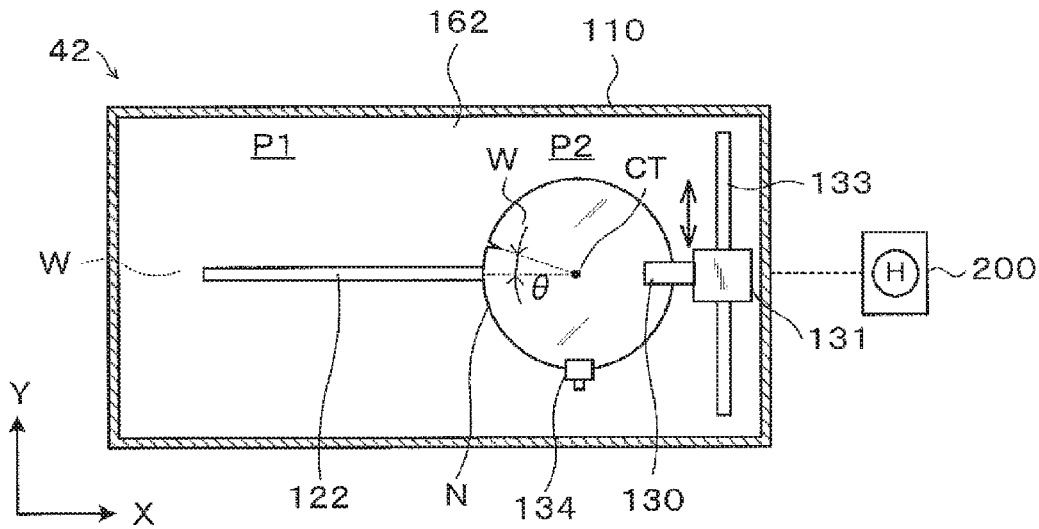
FIG. 9 is an explanatory view of a transverse section illustrating a state that the wafer is rotated by a predetermined angle in the edge exposure apparatus.
Figure 10:
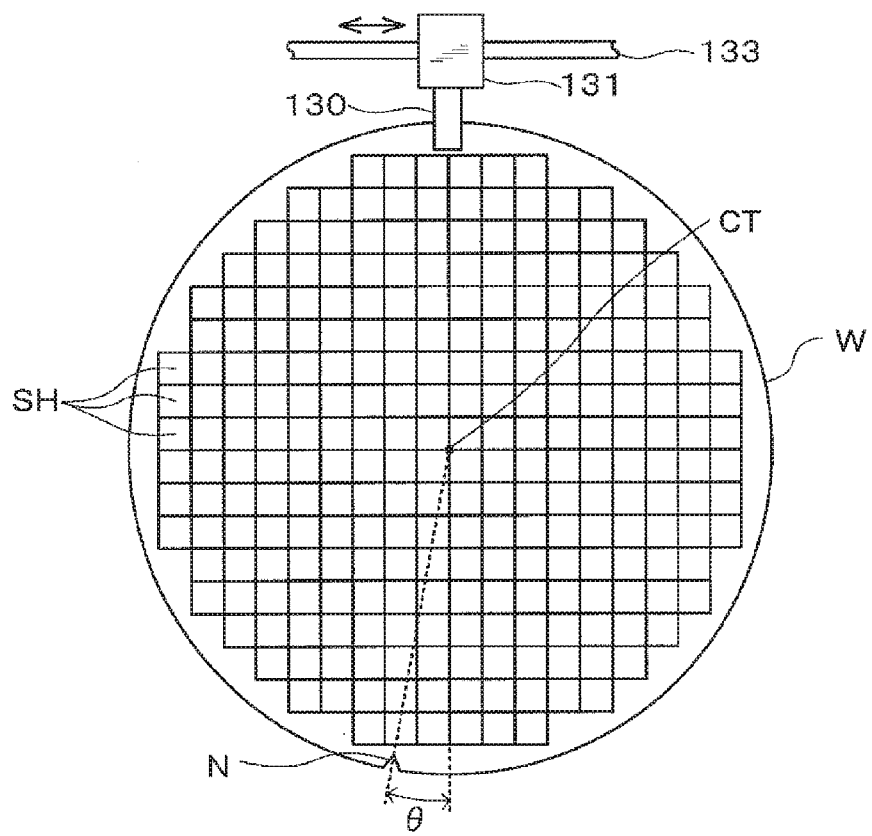
FIG. 10 is an explanatory view of a plane illustrating the positional relationship between the shots of the pattern on the wafer and an exposure unit.

After the wafer W held by the wafer chuck 120 is moved to the edge exposure position P2, the wafer W is rotated by the chuck drive unit 121 and the position of the notch portion N of the wafer W is confirmed by the position detection sensor 134. Once the position of the notch portion N is confirmed, the control unit 200 then rotates the wafer chuck 120 so that the position of the notch portion N of the wafer W held on the wafer chuck 120 is deviated, for example, by the angle θ from the direction in which the guide rail 122 extends as illustrated in FIG. 9. This makes the array direction of the shots SH parallel with the direction in which the guide rail 133 extends, namely, the direction in which the exposure unit 130 moves, for example, as illustrated in FIG. 10. The exposure unit 130 is moved on the guide rail 133 and thereby can be moved along the end portions of the shots SH.

Thereafter, light is applied from the exposure unit 130 to the edge portion of the wafer W to perform dummy shot. This dummy shot is performed on the recipe created in the control unit 200 on the basis of the substrate image IM. The creation of the recipe will be concretely described.

Figure 11:
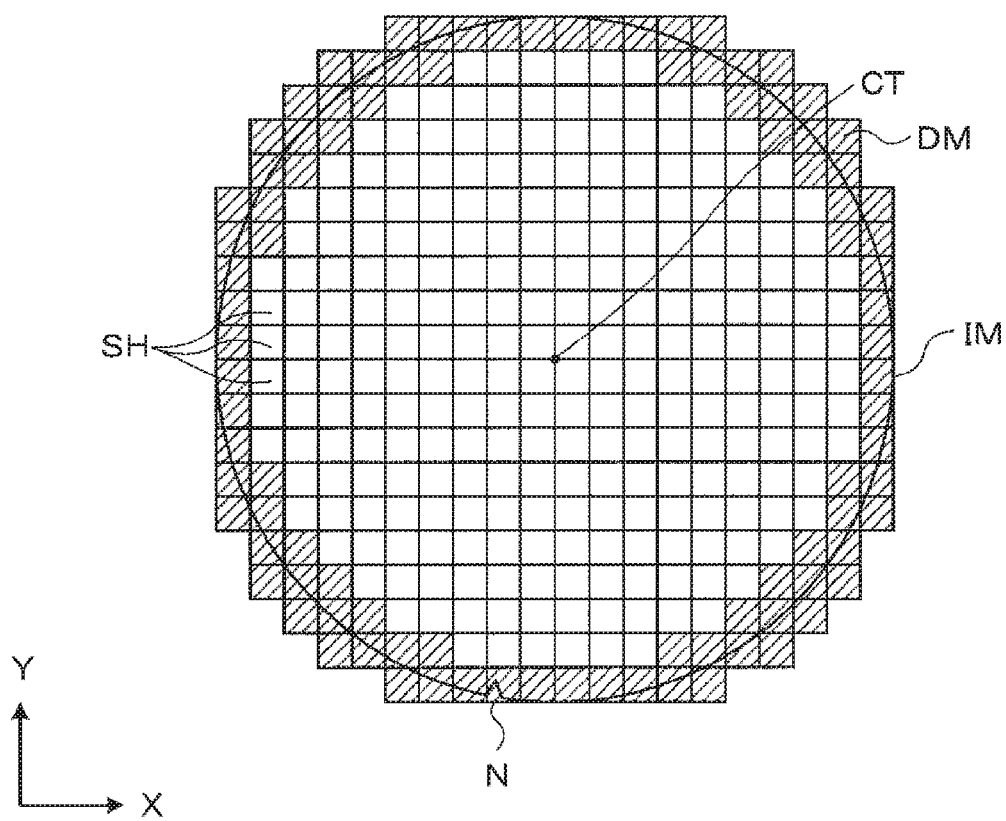
FIG. 11 is an explanatory view of a plane illustrating a dummy shot region.
Figures 12, 13:
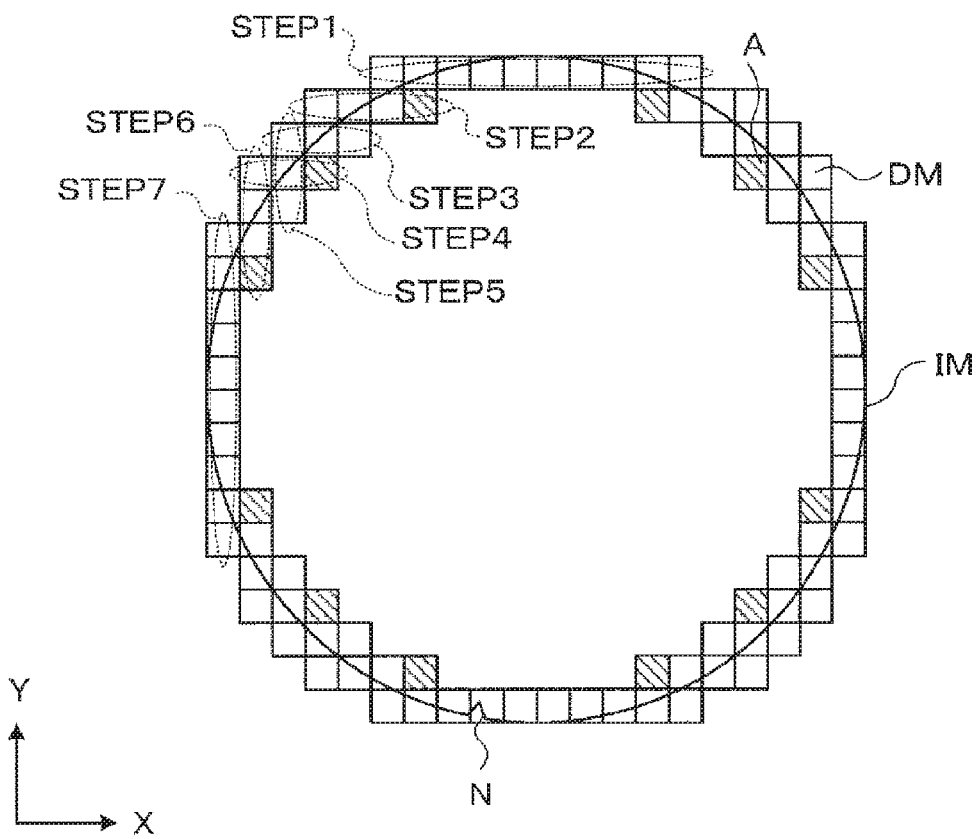
FIG. 12 is an explanatory view of a plane illustrating a dummy shot region.
FIG. 13 is an explanatory view illustrating a recipe of edge exposure processing.

For creating the recipe, the control unit 200 determines whether or not the outer edge portion of the substrate image IM, namely, the outer edge portion of the wafer W overlaps with the shots SH when the shots having the dimension obtained from the substrate image IM imaged by the inspection apparatus 50 cover the entire surface of the substrate image IM as illustrated in FIG. 11. Then, the control unit 200 determines that portions of the shots SH overlapping with the outer edge portion as dummy shot regions DM as indicated with diagonal lines in FIG. 11, and calculates the coordinates of each of the dummy shot regions DM. Note that a region A where the shot SH does not overlap with the outer edge portion of the wafer W indicated with diagonal lines in FIG. 12 is also displayed as the dummy shot region DM in FIG. 11. However, from the purpose of the edge exposure processing for removing the resist in an unrequired portion, the region A indicated with diagonal lines in FIG. 12 needs to be subjected to the dummy shot because the shot SH of the pattern is not formed. Therefore, the control unit 200 determines also the region A as the dummy shot region DM. In other words, the region A indicated with diagonal lines in FIG. 12 is a region that does not belong to any of the portion not overlapping with the outer edge portion and the shot SH, and also the region A is determined as the dummy shot region DM.

The control unit 200 calculates the coordinates of each of the dummy shot regions DM and then decides the order to perform the edge exposure processing on the dummy shot regions DM. More specifically, for example, the exposure unit 130 is moved along the guide rail 133 and the wafer chuck 120 is moved along the guide rail 122 like STEP 1 to STEP 4 indicated by broken lines in FIG. 12, whereby a recipe is created to perform exposure first for the dummy shot regions DM that can be subjected to exposure. In this event, for example, as illustrated in FIG. 13, the coordinates of the exposure start position and the exposure end position of the dummy shot regions DM where the dummy shot is performed in each of STEP 1 to STEP 4 are calculated based on the substrate image IM. Note that in FIG. 13, the coordinates of the upper right vertex of each dummy shot region DM are listed for convenience.

The exposure orders of STEP 5 to STEP 7 indicated in FIG. 12 are set after STEP 4 because the edge exposure processing is preferably performed, for example, with the wafer W rotated by 90 degrees clockwise. Also for STEP 5 to STEP 7, the coordinates of the exposure start position and the exposure end position of the dummy shot regions DM are similarly calculated. Then, also after STEP 7, the coordinates of the exposure start position and the exposure end position of the dummy shot regions DM are sequentially calculated, and a recipe of the edge exposure processing is created. The creation of the recipe is performed in advance before the wafer W whose substrate image IM is acquired in the inspection apparatus 50 is transferred into the edge exposure apparatus 42. Note that when the rotation center of the wafer chuck 120 and the center position CT of the wafer W are deviated into an eccentric state from the detection result in the position detection sensor 134, an eccentricity amount $\Delta X$ in the X-direction and an eccentricity amount $\Delta Y$ in the Y-direction may be added to the X-coordinate and the Y-coordinate listed in FIG. 13 for correction.

Note that the coordinates of the exposure start position and the exposure end position are calculated in a state that the notch portion N is inclined by the angle $\theta$ so that the dummy shot regions DM are arrayed along the X-direction and the Y-direction as illustrated in FIG. 11 and FIG. 12 in this embodiment, but the calculation method of the coordinates is not limited to the contents of this embodiment. For example, the coordinates may be calculated based on a substrate image IM in which a straight line linking the center position CT of the wafer W and the position of the notch portion N is parallel with the Y-direction in FIG. 12. In this case, for example, the coordinates illustrated in FIG. 13 are subjected to affine transformation using a determinant illustrated in FIG. 14, whereby coordinates $(X_\theta, Y_\theta)$ with the angle $\theta$ added can be obtained. Note that $\Delta X$ and $\Delta Y$ in FIG. 14 are the above-described eccentricity amounts.

Then, in the edge exposure apparatus 42, the chuck drive unit 121 and the exposure drive unit 132 are operated based on the recipe created in the control unit 200 and the edge exposure processing on the dummy shot region DM designated by the recipe is performed.

The wafer W is then transferred from the edge exposure apparatus 42 to the delivery unit 62 in the fourth block G4. The wafer W is then transferred by the wafer transfer apparatus 100 in the interface station 13 to the exposure apparatus 12 and subjected to exposure processing.

Next, the wafer W is transferred by the wafer transfer apparatus 100 from the exposure apparatus 12 to the delivery apparatus 60 in the fourth block G4. The wafer W is then transferred by the wafer transfer apparatus 70 to the thermal treatment apparatus 40 and subjected to a post-exposure baking treatment. The wafer W is then transferred by the wafer transfer apparatus 70 to the developing treatment apparatus 30 and developed. After the development is finished, the wafer W is transferred by the wafer transfer apparatus 70 to the thermal treatment apparatus 40 and subjected to a post-baking treatment.

Then, the wafer W is transferred to the cassette C in the cassette station 10. Thus, a series of photolithography process is completed.

According to the above embodiment, the imaging unit 160 images the wafer W which has been subjected to pattern exposure, to acquire the substrate image IM and thereby acquire array information of the shots SH of the pattern on the wafer W from the substrate image IM. Then, the control unit 200 creates the recipe for the edge exposure processing on the basis of the acquired array information of the shots SH and controls the chuck drive unit 121 and the exposure drive unit 132 on the basis of the recipe. Accordingly, even if the array of the shots SH of the pattern exposed in the exposure apparatus 12 is not in a state of being parallel or perpendicular to the line linking the notch portion N and the center position CT of the wafer W, in other words, even if the array of the shots SH on the wafer W is inclined by the angle $\theta$ with respect to the position of the notch portion N of the wafer W, the dummy shot can be appropriately performed in the edge exposure apparatus 42, based on the acquired array information.

Further, since one inspection apparatus 50, namely, one imaging unit 160 is provided in common for a plurality of edge exposure apparatuses 42, and the one imaging unit 160 acquires the array information of the shots SH of the pattern on the wafer W in the above embodiment, it is unnecessary to individually provide the imaging unit 160 for each of the edge exposure apparatuses 42. Accordingly, the facility cost of the substrate treatment system 1 can be reduced. Note that the number of the imaging unit 160 installed is not limited to the contents of this embodiment, but can be arbitrarily set.

Furthermore, the control unit 200 creates the recipe on the basis of the substrate image IM acquired by the inspection apparatus 50 before the wafer W is transferred into the edge exposure apparatus 42, so that immediately after the wafer W is transferred into the edge exposure apparatus 42, edge exposure processing can be performed thereon. Accordingly, the throughput in the edge exposure apparatus 42 never decreases.

Though the inspection apparatus 50 is disposed in the third block G3 in the treatment station 11 in the above embodiment, the installation place of the inspection apparatus 50 can be arbitrarily selected as long as the inspection apparatus 50 is disposed at a position where it can image the wafer W before the wafer W is transferred into the edge exposure apparatus 42. For example, the inspection apparatus 50 may be disposed in the second block G2. Similarly, the installation place of the edge exposure apparatus 42 can be arbitrarily selected as long as the edge exposure apparatus 42 can perform the edge exposure processing before the wafer W is transferred into the exposure apparatus 12, and for example, the edge exposure apparatus 42 may be disposed, for example, in the third block G3 or the fourth block G4.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention can employ not only the example but also various forms. The present invention is also applicable to the case where the substrate is other substrate such as an FPD (Flat Panel Display), a mask reticle for a photomask, and the like other than the wafer.

What is claimed is:

1. An edge exposure apparatus for exposing an edge portion of a substrate coated with a resist film, the edge exposure apparatus comprising:
   an imaging unit that images a front surface of the substrate;
   a substrate holding unit that holds the substrate;
   an exposure unit that exposes the edge portion of the substrate held on the substrate holding unit;
   a first moving mechanism that moves and rotates the substrate holding unit;
   a second moving mechanism that moves the exposure unit; and
   a control unit that controls the first moving mechanism and the second moving mechanism,
   wherein the control unit is configured to control the first moving mechanism and the second moving mechanism so as to acquire array information of a plurality of shots of a pattern on the substrate from a substrate image of a substrate, which has already been subjected to pattern exposure, imaged by the imaging unit, and expose the edge portion of the substrate, based on the acquired array information,
   wherein the control unit is further configured to:
   calculate a dimension of one shot of the plurality of shots of the pattern;
   dispose a plurality of imaginary shots, each having the calculated dimension of the one shot, to cover an entirety of the front surface of the substrate;
   determine which of the plurality of imaginary shots overlap with an outer edge portion of the substrate, as a region where the edge portion of the substrate is to be exposed;
   calculate coordinates of each of the plurality of imaginary shots which are determined to be the region where the edge portion of the substrate is to be exposed; and
   control at least any one of the first moving mechanism and the second moving mechanism, based on the calculated coordinates, so that the region where the edge portion is to be exposed is exposed by the exposure unit.

2. The edge exposure apparatus according to claim 1, wherein the control unit is configured to control the first moving mechanism so as to detect a center position of the substrate and a notch position of the substrate from the substrate image, find an angle formed between a straight line linking the center position of the substrate and the notch position of the substrate and an array direction of the shots of the pattern on the substrate, and rotate the substrate according to the found angle.

3. The edge exposure apparatus according to claim 2, wherein the imaging unit is provided in common for a plurality of the edge exposure apparatuses.

4. The edge exposure apparatus according to claim 1, wherein the imaging unit is provided in common for a plurality of the edge exposure apparatuses.

5. The edge exposure apparatus according to claim 1, wherein the control unit is further configured to determine which of the plurality of imaginary shots that are determined to not overlap with the outer edge portion of the substrate exist where the pattern on the substrate is not formed, to be included in the region where the edge portion is to be exposed by the exposure unit.

6. An edge exposure method using an edge exposure apparatus,
   the edge exposure apparatus comprising:
   an imaging unit that images a front surface of a substrate;
   a substrate holding unit that holds the substrate;
   an exposure unit that exposes an edge portion of the substrate held on the substrate holding unit;
   a first moving mechanism that moves and rotates the substrate holding unit; and
   a second moving mechanism that moves the exposure unit,
   the edge exposure method comprising: moving the substrate holding unit and the exposure unit so as to acquire array information of a plurality of shots of a pattern on the substrate from a substrate image of a substrate, which has already been subjected to pattern exposure, imaged by the imaging unit, and expose the edge portion of the substrate, based on the acquired array information,
   calculating a dimension of one shot of the plurality of shots of the pattern;
   disposing a plurality of imaginary shots, each having the calculated dimension of the one shot, to cover an entirety of the front surface of the substrate;
   determining which of the plurality of imaginary shots overlap with an outer edge portion of the substrate, as a region where the edge portion of the substrate is to be exposed;
   calculating coordinates of each of the plurality of imaginary shots which are determined to be the region where the edge portion of the substrate is to be exposed; and
   controlling at least any one of the first moving mechanism and the second moving mechanism, based on the calculated coordinates, so that the region where the edge portion is to be exposed is exposed by the exposure unit.

7. The edge exposure method according to claim 6, wherein the imaging unit is provided in common for a plurality of the edge exposure apparatuses.

8. The edge exposure method according to claim 6, wherein
   a center position of the substrate and a notch position of the substrate are detected from the substrate image;
   an angle formed between a straight line linking the center position of the substrate and the notch position of the substrate and an array direction of the shots of the pattern on the substrate is found; and
   the substrate holding unit is rotated according to the found angle.

9. The edge exposure method according to claim 6, further comprising determining which of the plurality of imaginary shots that are determined to not overlap with the outer edge portion of the substrate exist where the pattern on the substrate is not formed, to be included in the region where the edge portion is to be exposed by the exposure unit.

10. A non-transitory computer-readable storage medium storing a program running on a computer of a control unit configured to control an edge exposure apparatus to cause the edge exposure apparatus to perform an edge exposure method,
    the edge exposure apparatus comprising:
    an imaging unit that images a front surface of a substrate;
    a substrate holding unit that holds the substrate;
    an exposure unit that exposes an edge portion of the substrate held on the substrate holding unit;
    a first moving mechanism that moves and rotates the substrate holding unit; and a second moving mechanism that moves the exposure unit, and the edge exposure method comprising: moving the substrate holding unit and the exposure unit so as to acquire array information of a plurality of shots of a pattern on the substrate from a substrate image of a substrate, which has already been subjected to pattern exposure, imaged by the imaging unit, and expose the edge portion of the substrate, based on the acquired array information, calculating a dimension of one shot of the plurality of shots of the pattern;

disposing a plurality of imaginary shots, each having the calculated dimension of the one shot, to cover an entirety of the front surface of the substrate;

determining which of the plurality of imaginary shots overlap with an outer edge portion of the substrate, as a region where the edge portion of the substrate is to be exposed;

calculating coordinates of each of the plurality of imaginary shots which are determined to be the region where the edge portion of the substrate is to be exposed; and controlling at least any one of the first moving mechanism and the second moving mechanism, based on the calculated coordinates, so that the region where the edge portion is to be exposed is exposed by the exposure unit.

11. The non-transitory computer-readable storage medium according to claim 10,
wherein the imaging unit is provided in common for a plurality of the edge exposure apparatuses.

12. The non-transitory computer-readable storage medium according to claim 10, wherein
a center position of the substrate and a notch position of the substrate are detected from the substrate image;
an angle formed between a straight line linking the center position of the substrate and the notch position of the substrate and an array direction of the shots of the pattern on the substrate is found; and
the substrate holding unit is rotated according to the found angle.

13. The non-transitory computer-readable storage medium according to claim 10, the edge exposure method further comprising determining which of the plurality of imaginary shots that are determined to not overlap with the outer edge portion of the substrate exist where the pattern on the substrate is not formed, to be included in the region where the edge portion is to be exposed by the exposure unit.

* * * * *